United States Patent
Iwakami

(10) Patent No.: US 7,642,556 B2
(45) Date of Patent: Jan. 5, 2010

(54) COMPOUND SEMICONDUCTOR ELEMENT RESISTIBLE TO HIGH VOLTAGE

(75) Inventor: Shinichi Iwakami, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 30 days.

(21) Appl. No.: 11/857,458

(22) Filed: Sep. 19, 2007

(65) Prior Publication Data
US 2008/0087897 A1    Apr. 17, 2008

(30) Foreign Application Priority Data
Oct. 17, 2006  (JP)  ............................. 2006-008414
Nov. 29, 2006  (JP)  ............................. 2006-322456

(51) Int. Cl.
*H01L 31/0256* (2006.01)

(52) U.S. Cl. ..................... 257/76; 257/73; 257/E29.338

(58) Field of Classification Search .................. 257/76, 257/E29.338
See application file for complete search history.

(56) References Cited

U.S. PATENT DOCUMENTS

| | | | | |
|---|---|---|---|---|
| 5,767,581 | A * | 6/1998 | Nakamura et al. | 257/749 |
| 6,057,565 | A * | 5/2000 | Yoshida et al. | 257/102 |
| 7,274,083 | B1 * | 9/2007 | Sankin et al. | 257/471 |
| 7,382,001 | B2 * | 6/2008 | Beach | 257/194 |
| 2003/0052328 | A1 * | 3/2003 | Uemura | 257/103 |
| 2004/0080010 | A1 * | 4/2004 | Parikh et al. | 257/471 |
| 2005/0189559 | A1 * | 9/2005 | Saito et al. | 257/189 |
| 2006/0108659 | A1 | 5/2006 | Yanagihara et al. | |
| 2006/0170003 | A1 * | 8/2006 | Saito et al. | 257/189 |
| 2006/0226415 | A1 * | 10/2006 | Nishijima et al. | 257/11 |
| 2006/0284230 | A1 * | 12/2006 | Yang et al. | 257/306 |
| 2007/0012930 | A1 * | 1/2007 | Liu et al. | 257/80 |
| 2007/0051977 | A1 * | 3/2007 | Saito et al. | 257/192 |
| 2007/0145396 | A1 * | 6/2007 | Watanabe et al. | 257/98 |
| 2007/0210329 | A1 * | 9/2007 | Goto | 257/147 |
| 2007/0228401 | A1 * | 10/2007 | Machida et al. | 257/96 |
| 2007/0254431 | A1 * | 11/2007 | Saito et al. | 438/253 |
| 2007/0284606 | A1 * | 12/2007 | Sugimori | 257/99 |
| 2008/0048202 | A1 * | 2/2008 | Tazima et al. | 257/98 |
| 2008/0277674 | A1 * | 11/2008 | Nagai et al. | 257/88 |

\* cited by examiner

*Primary Examiner*—Kiesha L. Rose
*Assistant Examiner*—Igwe U Anya
(74) *Attorney, Agent, or Firm*—Bachman & LaPointe, P.C.

(57) ABSTRACT

A compound semiconductor element is provided which electrically connects an electrode 3 formed on one main surface 2a of a compound semiconductor region 2 with a substrate 5 to fix an electric potential of substrate 5 at an electric potential of electrode 3, thereby preventing fluctuation in electric potential of substrate 5 under the changing operating condition of the device for stabilization in electric property of the device. Also, formed between compound semiconductor region 2 and substrate 5 is an insulating layer 6 for blocking a leakage current which may flow longitudinally between one main surface 2a of compound semiconductor region 2 and substrate 5 so that sufficiently high withstand voltage property can be given between compound semiconductor region 2 and substrate 5. In addition, formed in compound semiconductor region 2 is a notch 14 which extends in the thickness direction from main surface 2a of compound semiconductor region 2 and reaches at least insulating layer 6, and an insulating protective layer 15 covers a side surface of a conductive film 7 exposed to the notch 14 to prevent occurrence of electric discharge between conductive film 7 and substrate 5 for stable and high withstand voltage.

6 Claims, 1 Drawing Sheet

COMPOUND SEMICONDUCTOR ELEMENT RESISTIBLE TO HIGH VOLTAGE

TECHNICAL FIELD

This invention relates to a compound semiconductor element of such as gallium nitride resistible to high voltage.

BACKGROUND OF THE INVENTION

Gallium nitride compound semiconductor elements are attracting customers' attention as semiconductor devices for high frequency and high power because they have their high breakdown electric field and high electron mobility of substantially the same level as that of gallium arsenide semiconductor. For example, a prior art Schottky barrier diode utilizing gallium nitride, comprises a sapphire base plate, a compound semiconductor region of gallium nitride prepared by forming a buffer layer of a single or a plurality of laminated gallium nitride (GaN) compound semiconductor layers on the base plate and further forming undoped gallium nitride (GaN) and undoped aluminum gallium nitride (AlGaN) layers on the buffer layer, a Schottky barrier electrode formed on a top surface of the compound semiconductor region, and an ohmic electrode. The Schottky barrier electrode forms a Schottky barrier on a boundary surface of AlGaN layer, and ohmic electrode is in contact to AlGaN layer with low resistance. By way of example, U.S. 2006/0108659 A1 shows a gallium nitride compound semiconductor element having a Schottky barrier electrode.

Recently, attempts have been made to utilize silicon base plates in lieu of sapphire base plates. A gallium nitride compound semiconductor formed on a silicon base plate is advantageous because it can easily be mechanically processed such as dicing and manufactured in lower cost compared to gallium nitride compound semiconductor on a sapphire base plate.

On the other hand, gallium nitride compound semiconductor shows a drawback of fluctuation in electric potential of electrically conductive base plate of such as silicon depending on change in an operating condition of the device, thereby undesirably making electric property of the device unstable. To solve this problem, an effort has also been devoted to electrically connect an electrode formed on a bottom surface of base plate to an anode electrode, thereby clamping the base plate at electric potential of anode electrode.

A semiconductor element of the structure connecting an electrode of base plate to an anode electrode has still a deficiency in that it cannot sufficiently increase withstand voltage because a leakage current flows in the thickness or vertical direction along a side or creepage surface of the element between compound semiconductor region and base plate when voltage is applied between base plate and anode electrode formed on a top surface of gallium nitride compound semiconductor region. To solve this problem, a proposition has been offered to thicken compound semiconductor region to reduce leakage current for improvement in withstand voltage. However, it is very difficult to epitaxially grow a thicker compound semiconductor region of good crystallization on a silicon base plate.

In another aspect, it was thought that a well-known silicon-on-insulator (SOI) base plate is used to interpose an insulating film between a silicon base plate and a gallium nitride compound semiconductor region to reduce leakage current for improved withstand voltage. However, even in this element structure, electric discharge may occur between side surfaces of compound semiconductor region or electrically conductive film and base plate, and it can hardly establish its stable and high withstand voltage property. Also, a high electron mobility transistor (HEMT) has the structure which comprises a silicon base plate, a gallium nitride compound semiconductor region layered on silicon base plate, and source, drain and gate electrodes formed on gallium nitride compound semiconductor region wherein source or drain electrode is electrically connected to silicon base plate, however, for similar reasons as above-mentioned, HEMT also disadvantageously cannot establish its stable and high withstand voltage property. Moreover, a similar difficulty arises when using electric conductive base plates other than silicon base plate.

In this way, it was difficult to establish a high withstand voltage in a prior art compound semiconductor element which electrically connects a surface electrode laminated on conductive base plate with conductive base plate.

An object of the present invention is to provide a compound semiconductor element which indicates a high withstand voltage property although it comprises a conductive base plate, a compound semiconductor region laminated on the conductive base plate and a surface electrode formed on the compound semiconductor region and electrically connected to the base plate.

SUMMARY OF THE INVENTION

The compound semiconductor element according to the present invention, comprises a base plate (1), a compound semiconductor region (2) formed on a main surface of base plate (1), and electrodes (3, 4) formed on one main surface (2a) of compound semiconductor region (2). Base plate (1) comprises a substrate (5) of an electrically conductive material electrically connected to one of electrodes (3, 4), an insulating layer (6) formed on one main surface of substrate (5) and a conductive film (7) formed on main surface of substrate (5) through insulating layer (6). One of electrodes (3, 4) formed on a main surface (2a) of compound semiconductor region (2) is electrically connected to substrate (5) to fix electric potential of substrate (5) at electric potential of electrode (3), thereby preventing fluctuation in electric potential of substrate (5) under the changing operating condition of the device for stabilized electric property of the device. Also, formed between compound semiconductor region (2) and substrate (5) is insulating layer (6) for blocking a leakage current which may flow longitudinally between one main surface (2a) of compound semiconductor region (2) and substrate (5) so that sufficiently high withstand voltage property can be applied between compound semiconductor region (2) and substrate (5). In addition, formed in compound semiconductor region (2) is a notch (14) which extends in the thickness direction from main surface (2a) of compound semiconductor region (2) and reaches at least insulating layer (6) while an insulating protective layer (16) covers a side surface of a conductive film (7) exposed to the notch (14) to prevent occurrence of electric discharge between conductive film (7) and substrate (5) for stable and high withstand voltage. Unless stated otherwise, the formulation "compound semiconductor element" herein means a compound semiconductor element which may produce electric discharge between compound semiconductor region and base plate, and it of course includes Schottky barrier diodes and high electron mobility transistors.

In an embodiment of the compound semiconductor element according to the present invention, comprises a base plate (1) of an electrically conductive material, a compound semiconductor region (2) formed on a main surface of base plate (1), and electrodes (3, 4) formed on one main surface (2a) of compound semiconductor region (2) for electrical connection of one of electrodes (3, 4) to base plate (1). Compound semiconductor region (2) is formed with a notch (14) which extends in the thickness direction from main surface (2a) of compound semiconductor region (2) to one main surface (1a) of base plate (1) to cover, with an insulating protective layer (16), a side surface of compound semiconductor region (2) exposed to notch (14).

The present invention can provide a highly reliable compound semiconductor element capable of preventing electric discharge along a side surface of compound semiconductor region while indicating the stable electric property and high withstand voltage property.

BRIEF DESCRIPTION OF THE DRAWINGS

The above-mentioned and other objects and advantages of the present invention will be apparent from the following description in connection with preferred embodiments shown in the accompanying drawings wherein.

BEST MODE FOR CARRYING OUT THE INVENTION

Embodiments of the present invention applied to a gallium nitride compound semiconductor element will be described hereinafter in connection with FIGS. 1 and 2 of the drawings. Same reference symbols are applied to denote similar portions in these drawings.

Figure 1:
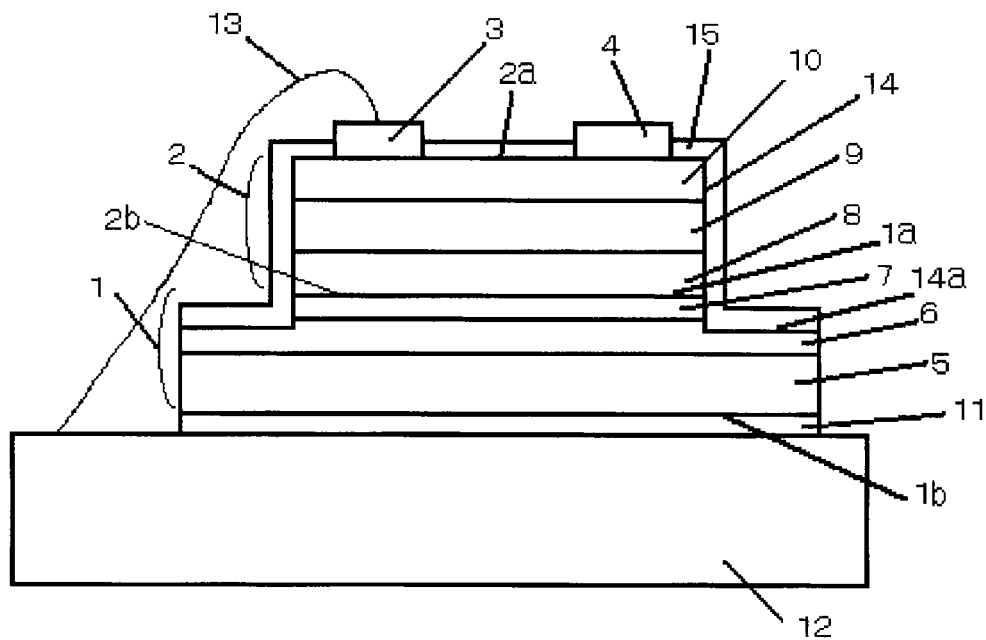
FIG. 1 is a sectional view of a Schottky barrier diode showing a first embodiment according to the present invention.

FIG. 1 shows a first embodiment of the present invention applied to a Schottky barrier diode.

Schottky barrier diode according to the first embodiment comprises a base plate 1, a compound semiconductor region 2 of gallium nitride formed on one main surface 1a of base plate 1, and anode and cathode electrodes 3 and 4 formed on a main surface 2a of compound semiconductor region 2. Base plate 1 comprises a substrate 5 formed of electrically conductive monocrystalline silicon, an insulating film 6 of such as electrically conductive silicon oxide, an electrically conductive film 7 of monocrystalline silicon formed on a surface of insulating film 6 and a break-out or signal-pick out electrode 11 formed on the other main surface 1b of base plate 1. Accordingly, conductive film 7 forms one main surface 1a of base plate 1 exposed to compound semiconductor region 2, and substrate 5 forms the other main surface 1b of base plate 1 exposed to break-out electrode 11.

Compound semiconductor region 2 comprises a buffer layer 8 formed on one main surface 1a of base plate 1, namely an upper surface of conductive film 7, an undoped GaN layer 9 as an electron transit layer formed on a surface of buffer layer 8, and an undoped AlGaN layer 10 as an electron donation layer formed on a surface of GaN layer 9.

Schottky barrier diode of the first embodiment utilizes buffer layer 8 which is a multilayered or superlattice buffer layer prepared by repetitively forming AlN and GaN layers on conductive film 7, but alternatively, may utilize a single buffer layer 8 of such as AlN. Buffer layer 8 serves to absorb, temper or lessen the difference between lattice constants of base plate 5 and/or conductive film 7 formed of silicon and gallium nitride compound semiconductor region 2 to prevent crystal fault from occurring in compound semiconductor region 2.

Anode and cathode electrodes 3 and 4 are formed on one main surface 2a of compound semiconductor region 2, namely a top surface of AlGaN layer 10. Anode electrode 3, which consists of for example nickel (Ni) and gold (Au), provides a Schottky barrier electrode for forming a Schottky barrier on a boundary surface with AlGaN layer 10. Cathode electrode 4, which consists of for example titanium (Ti) and aluminum (Al), provides an ohmic electrode in contact to AlGaN layer 10 with low resistance.

Supply of electric charge based on piezoelectric polarization and spontaneous polarization forms a two-dimensional dense electron gas layer (or two-dimensional hole gas layer) of the density in the order of approximately $10^{13}$ cm$^{-2}$ between on a boundary surface between GaN layer 9 and AlGaN layer 10. Existence of two-dimensional electron gas layer causes electric current to flow in compound semiconductor region 2 parallel to the boundary surface. Specifically, when voltage is applied between anode and cathode electrodes 3 and 4 with the higher potential on anode electrode 3, electric current flows from anode electrode 3 through compound semiconductor region 2 to cathode electrode 4.

The Schottky barrier diode of the first embodiment electrically connects anode electrode 3 to the other main surface 1b of base plate 1 namely substrate 5. In detail, formed on the other main surface of base plate 5 is break-out electrode 11 bonded on a support plate or heat sink 12 by solder or brazing material, and one and the other ends of wiring or lead wire 13 is connected respectively on a surface of anode electrode 3 and support plate 12 both by wire bonding. As a result, substrate 5 is electrically connected to anode electrode 3 through support plate 12 and wiring 13 to maintain the same electric potential of substrate 5 as that of anode electrode 3 so that electrical connection between substrate 5 and anode electrode 3 serves to repress change in electric potential of substrate 5 under the varying operating condition of the device to firmly steady electric characteristic of the device.

The Schottky barrier diode of this embodiment is formed with a notch or cutout 14 in compound semiconductor region 2, extending from one main surface 2a of compound semiconductor region 2 to insulating film 6. Notch 14 is formed in a loop or annular shape in an imaginary plan view along a whole outer periphery of compound semiconductor region 2. Notch 14 extends from one main surface 2a of compound semiconductor region 2 toward the other main surface 1b of base plate 1 in the thickness direction to form a bottom surface 14a of notch 14 below one main or top surface of insulating film 6. Accordingly, side surfaces of notch 14 expose, to outside, each entire side surface of buffer layer 8, GaN layer 9, AlGaN layer 10 and conductive layer 7 and a part of side surface of insulating film 6, and simultaneously, a bottom surface of notch 14 exposes, to outside, top surface of insulating film 6. In this way, notch 14 provides a ring-like cutout which includes top and side surfaces of the element, and an insulating protective film 15 of silicon nitride, which may be formed by plasma CVD technique, annularly seals exposed whole side surfaces of conductive film 7 and compound semiconductor region 2 to outside from side surfaces of notch 14.

In this way, insulating protective film 15 is formed on notch 14 to cover side surfaces of buffer layer 8, GaN layer 9, AlGaN layer 10, conductive film 7 and insulating film 6 for forming side surfaces of notch 14 and upper surface of insulating film 6 for forming a bottom surface of notch 14 so that each side surface of buffer layer 8, GaN layer 9, AlGaN layer 10 and conductive film 6 is unexposed to outside from side surfaces of the element. On the other hand, lower side surface of insulating film 6 and side surface of substrate 5 are exposed to outside from side surfaces of the element without covering by notch 14. In this way, as conductive film 7 and compound semiconductor region 2 formed on insulating film 6 are shielded to preferably prevent generation of electric discharge along side surfaces of the element, thereby eventually causing stabilized high withstand voltage of the element, in particular, establishing high voltage resistance of gallium nitride compound semiconductor element vulnerable to static electricity.

In the shown embodiment, insulating protective film 15 extends over one main surface 2a of compound semiconductor region 2 to cover one main surface 2a on which anode and cathode electrodes 3 and 4 are formed. In other words, insulating protective film 15 spreads from side surfaces of conductive film 7 in one direction to one main surface 2a of compound semiconductor region 2 and toward base plate 1 in the other direction to cover, with insulating protective film 15, bare side surfaces of compound semiconductor region 2 and insulating film 6 open to side surfaces of notch 14 and bare top surface of insulating film 6 open to bottom surfaces of notch 14.

The Schottky barrier diode of the first embodiment has the following advantages:

[1] Substrate 5 is electrically connected to anode electrode 3 formed on one main surface 2a of compound semiconductor region 2 to secure substrate 5 at the same electric potential as that of anode electrode 3 and thereby control or restrain fluctuation in electric potential of substrate 5 for consistent electric property of the device.

[2] Insulating film 6 layered between compound semiconductor region 2 and substrate 5 serves to effectively block or cut off creeping electric current flow longitudinally or vertically running along side surfaces between one main surface 2a of compound semiconductor region 2 and substrate 5, thereby achieving high voltage resistance between compound semiconductor region 2 and substrate 5.

[3] Provided in compound semiconductor region 2 is notch 14 which extends from one main surface 2a in the thickness direction and reaches at least insulating film 6, and insulating protective film 15 covers and insulates side surfaces of compound semiconductor region 2 and conductive film 7 open to notch 14 to positively prevent occurrence of electric discharge between compound semiconductor region 2 or conductive film 7 and substrate 5 for stable and high withstand voltage.

[4] Upon forming substrate 5 and conductive film 7 of silicon, they can easily be made by a machining process such as dicing to provide an inexpensive gallium nitride Schottky barrier diode.

[5] Compound semiconductor region 2 of relatively better crystallization can grow on a so-called silicon-on-insulator (SOI) base plate since conductive film 7 of silicon monocrystallization provides a good stratum for growing compound semiconductor region 2.

Figure 2:
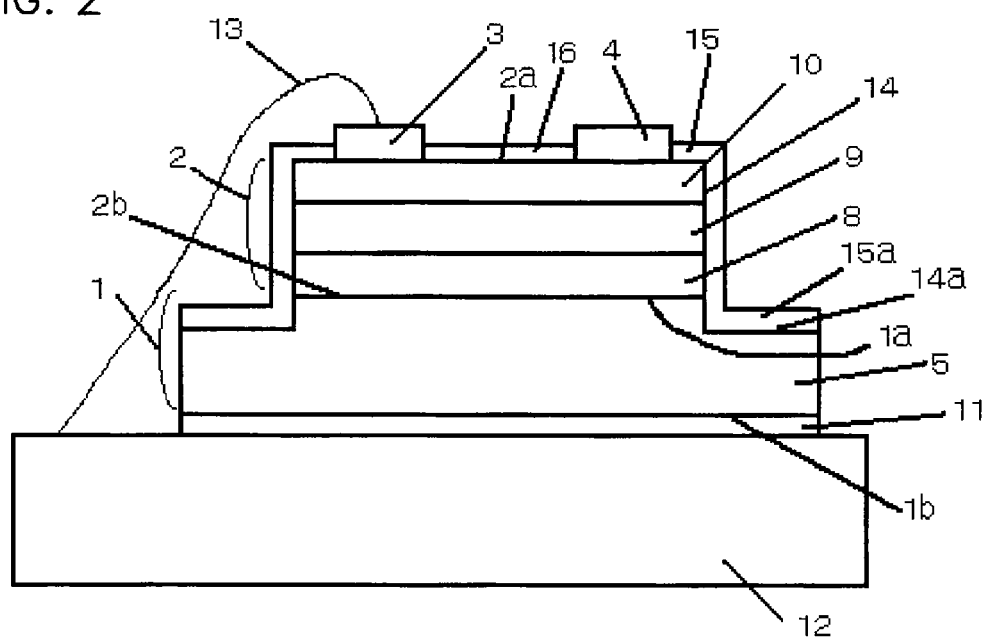
FIG. 2 is a sectional view of a Schottky barrier diode showing a second embodiment according to the present invention.

FIG. 2 shows a second embodiment of the present invention applied to a Schottky barrier diode which, as shown, comprises an electrically conductive base plate 1, a gallium nitride compound semiconductor region 2 formed on one main surface of base plate 1, anode and cathode electrodes 3 and 4 formed on one main surface of compound semiconductor region 2, and a break-out electrode 11 formed on the other main or bottom surface 1b of base plate 1. Base plate 1 comprises a substrate 5 of silicon monocrystallization. Compound semiconductor region 2 comprises a buffer layer 8 formed on main surface 1a of base plate 1, an undoped GaN layer 9 as an electron transit layer formed on a surface of buffer layer 8, and an undoped AlGaN layer 10 as an electron donation layer formed on a surface of GaN layer 9.

Schottky barrier diode of the second embodiment employs multilayered or superlattice buffer layer 8 prepared by repetitively forming AlN and GaN layers, but, instead, may utilize a single buffer layer 8 of such as AlN. Buffer layer 8 functions to absorb, temper or lessen the difference between lattice constants of base plate 5 and compound semiconductor region 2 to prevent occurrence of crystal fault in compound semiconductor region 2.

Supply of electric charge based on piezoelectric polarization and spontaneous polarization allows a two-dimensional dense electron gas layer (or two-dimensional hole gas layer) of the density in the order of approximately $10^{13}$ cm$^{-2}$ to form between on a boundary surface between GaN layer 9 and AlGaN layer 10. When voltage is applied between anode and cathode electrodes 3 and 4 with the higher potential on anode electrode 3, existence of two-dimensional electron gas layer causes electric current to flow from anode electrode 3 through two-dimensional electron gas layer to cathode electrode 4 parallel to one main surface 2a of compound semiconductor region 2.

Anode and cathode electrodes 3 and 4 are formed on one main surface 2a of compound semiconductor region 2, namely a top surface of AlGaN layer 10. Anode electrode 3, which consists of for example nickel (Ni) and gold (Au), provides a Schottky barrier electrode for forming a Schottky barrier on a boundary surface with AlGaN layer 10. Cathode electrode 4, which consists of for example titanium (Ti) and aluminum (Al), provides an ohmic electrode in contact to AlGaN layer 10 with low resistance.

The Schottky barrier diode of the second embodiment electrically connects anode electrode 3 to substrate 5 by taking processes of firstly forming break-out electrode 11 on the other main surface of base plate 5, secondly bonding break-out electrode 11 on a support plate or heat sink 12 by solder or brazing material, thirdly connecting one end of wiring or lead wire 13 on a surface of anode electrode 3 by wire bonding and then, finally connecting the other end of wiring 13 to support plate 12 by wire bonding. As a consequence, substrate 5 comes to an electric potential of the level same as that of anode electrode 3 through support plate 12 and wiring 13 to keep the potential of substrate 5 unchanged for stabilization in electric characteristic of the device even though the operation condition of the device changes.

Notch 14 formed in the Schottky barrier diode of the second embodiment extends from one main surface 2a of compound semiconductor region 2 and reaches substrate 5, and notch 14 has a loop or annular shape in an imaginary plan view along a whole outer periphery of compound semiconductor region 2 or semiconductor element. In other words, notch 14 spreads from one main surface 2a of compound semiconductor region 2 toward the other main surface 1b of base plate 1 in the thickness direction of the element so that bottom surface 14a of notch 14 extends toward the other main surface of substrate 5 beyond a boundary surface 2b between compound semiconductor region 2 and substrate 5. As a result, side surfaces of notch 14 exposes to outside each whole side surface of buffer layer 8, GaN layer 9, AlGaN layer 10 and a part of side surface of substrate 5, and simultaneously, a bottom surface of notch 14 exposes top surface of substrate 5 to outside. In this way, notch 14 provides a ring-like cutout which includes opened top and side surfaces of the element. An insulating protective film 15 is formed across boundary surface 2b and on side surfaces of compound semiconductor region 2 and base plate 1 open to notch 14, and an extension of insulating protective film 15 seals and covers upper surface of base plate 1 exposed to bottom surface of notch 14.

In this way, insulating protective film 15 is formed on notch 14 to cover side surfaces of buffer layer 8, GaN layer 9, AlGaN layer 10 and substrate 5 for forming side surfaces of notch 14 and upper surface of substrate 5 for forming a bottom surface of notch 14 so that each side surface of buffer layer 8, GaN layer 9, AlGaN layer 10 and conductive film 6 is unexposed to outside from side surfaces of the element. In this way, insulating protective film 15 for sealing side surface of compound semiconductor region 2 formed on substrate 5 can preferably prevent generation of electric discharge between substrate 5 and compound semiconductor region 2, thereby eventually establishing stabilized high withstand voltage of the element. In other words, even if substrate 5 is exposed for bottom surface 14a of notch 14, insulating protective film 15 can extend to shield upper surface of substrate to reliably inhibit the above-mentioned electric discharge.

In the shown embodiment, insulating protective film 16 of silicon oxide is formed on one main surface 2a of compound semiconductor region 2 to cover one main surface 2a of compound semiconductor region 2 except anode and cathode electrodes 3 and 4. In the second embodiment, notch 14 is an annular cutout formed on top and side surfaces of the element, and whole exposed side surfaces of compound semiconductor region 2 for forming side surfaces of notch 14 are coated with insulating protective film 15 of silicon nitride, and also one main surface 2a of compound semiconductor region 2 is coated with insulating protective film 16 of silicon oxide. In this case, after insulating protective film 15 of silicon nitride is formed by plasma CVD technique, it is masked to then form insulating protective film 16 can be formed by plasma CVD.

The Schottky barrier diode of the second embodiment can produce the following further advantage.

[6] Bare portions of compound semiconductor region 2 and other regions can be covered with insulating protective film 15 of silicon nitride excellent in humidity resistance and coatability for stable and high withstand voltage. Furthermore, one main surface 2a of compound semiconductor region 2 can be covered with insulating protective film 16 of silicon oxide to reduce leakage current.

First and second embodiments shown in FIGS. 1 and 2 exemplify Schottky barrier diodes, but the present invention can be applied to other semiconductor devices. For example, in case the instant invention is applied to a high electron mobility transistor (HEMT), gallium nitride compound semiconductor region 2 is layered on silicon substrate 5 through insulating and conductive films 6 and 7, and source, drain and gate electrodes are formed on one main surface 2a of compound semiconductor region 2. Then, source or drain electrode is electrically connected to break-out electrode 11 formed on bottom surface of silicon base plate 1, and notch 14 can be formed which extends from one main surface 2a of compound semiconductor region 2 and reaches insulating film 6. After that, insulating protective films 15 and 16 are formed to seal each side surface of compound semiconductor region 2, conductive film 7 and insulating film 6 for forming side surfaces of notch 14 and upper surface of insulating film 6 for forming bottom surfaces 14a of notch 14. Similar functions and effects as those in the foregoing embodiments can be obtained in this HEMT.

In place of wiring for electrically connecting anode electrode 3 formed on one main surface 2a of compound semiconductor region 2 with substrate 5, an alternative can preferably be adopted by forming a bore or through-hole which extends from one main surface 2a of compound semiconductor region 2 to substrate 5 and filling in the bore a conductive material or film for electrically connecting anode electrode 3 and substrate 5. In this case, the bore may reach bottom surface of substrate 5 to connect the bore with an electrode formed on bottom surface of substrate 5 or may terminate on the way before bottom surface of substrate 5. In lieu of bore or through-hole, a channel, pathway or the like may be used. Also, upper surface of substrate 5 exposed to bottom surface 14a of notch 14 extending to substrate 5 may be coated with insulating protective film 15 or 16. Substrate 15 may be formed of silicon carbide as a substitute for silicon. The present invention is also applicable to compound semiconductors other than gallium nitride compound semiconductor.

What is claimed is:

1. A compound semiconductor element comprising a base plate, a compound semiconductor region formed on a main surface of said base plate, and electrodes formed on one main surface of said compound semiconductor region, said base plate comprising a substrate of an electrically conductive material electrically connected to one of said electrodes, an insulating layer formed on one main surface of said substrate and a conductive film formed on the main surface of said substrate through said insulating layer, a notch being formed to extend in the thickness direction from said main surface of said compound semiconductor region and reach at least a boundary surface between said conductive film and insulating layer, and an insulating protective layer covering a side surface of said conductive film exposed to said notch.

2. The compound semiconductor element of claim 1, wherein said insulating protective layer extends from the side surface of said conductive film toward one main surface of said compound semiconductor region and said base plate to cover side surfaces of said insulating layer exposed to said notch.

3. The compound semiconductor element of claim 2, wherein a bottom surface of said notch exposes to outside said insulating layer whose upper surface is in contact to said insulating protective layer.

4. The compound semiconductor element of claim 1, wherein said substrate is a silicon monocrystalline substrate, said conductive film is a silicon monocrystalline film, and said compound semiconductor region is of a gallium nitride compound.

5. The compound semiconductor element of claim 1, wherein said notch is formed into a loop around an outer periphery of the compound semiconductor element to expose said conductive film on a side surface of said notch, and said insulating protective layer covers a whole side surface of said exposed conductive film.

6. The compound semiconductor element of claim 1, wherein said insulating protective layer is formed of a silicon nitride film, and one main surface of said compound semiconductor region is coated with an insulating protective film of silicon oxide.

* * * * *